United States Patent
Wen et al.

(10) Patent No.: US 7,913,144 B2
(45) Date of Patent: Mar. 22, 2011

(54) DIAGNOSTIC DEVICE, DIAGNOSTIC METHOD, PROGRAM, AND RECORDING MEDIUM

(75) Inventors: Xiaoqing Wen, Fukuoka (JP); Seiji Kajihara, Fukuoka (JP); Kohei Miyase, Fukuoka (JP); Yoshihiro Minamoto, Fukuoka (JP); Hiroshi Date, Fukuoka (JP)

(73) Assignees: Japan Science & Technology Agency, Saitama (JP); Kyushu Institute of Technology, Fukuoka (JP); System JD Co., Ltd., Fukuoka (JP)

( * ) Notice: Subject to any disclaimer, the term of this patent is extended or adjusted under 35 U.S.C. 154(b) by 143 days.

(21) Appl. No.: 12/513,401

(22) PCT Filed: Oct. 24, 2007

(86) PCT No.: PCT/JP2007/070738
§ 371 (c)(1),
(2), (4) Date: May 4, 2009

(87) PCT Pub. No.: WO2008/056541
PCT Pub. Date: May 15, 2008

(65) Prior Publication Data
US 2010/0064191 A1   Mar. 11, 2010

(30) Foreign Application Priority Data

Nov. 6, 2006 (JP) ................... 2006-301012

(51) Int. Cl.
*G06F 11/00* (2006.01)
(52) U.S. Cl. .......................... 714/741; 714/32
(58) Field of Classification Search ............... 340/450.2; 257/724; 324/762.02; 714/724, 718, 723, 714/741, 32
See application file for complete search history.

(56) References Cited

U.S. PATENT DOCUMENTS
4,246,566 A * 1/1981 Endo et al. ............. 340/450.2
(Continued)

FOREIGN PATENT DOCUMENTS
JP    06-034712    2/1994

OTHER PUBLICATIONS
International Search Report for PCT/JP2007/070738 dated Jan. 17, 2008.

*Primary Examiner* — David Ton
(74) *Attorney, Agent, or Firm* — Rankin Hill & Clark LLP

(57) ABSTRACT

Provided are a diagnostic device and the like providing a favorable diagnosis result by further improving the diagnosis resolution. A diagnostic device 1 has a symbol injection part 3, which is composed of a symbol injection part for an active element 5 and a symbol injection part for a passive element 7, an occurrence probability providing part 9, an equal occurrence probability providing part 11, and a switching part 13. A per-test X-fault diagnosis flow by the diagnostic device 1 consists of a stage for collecting diagnostic information and a stage for drawing diagnostic conclusion. The layout of a deep-submicron LSI circuit usually needs to involve multiple layers, which means that vias are extensively used. Since via information is utilized by the symbol injection part for a passive element 7, it becomes possible to locate defects to the via level, greatly improving the diagnostic resolution. Since, by the occurrence probability providing part 9, a new diagnosis value is used and, the occurrence probabilities of possible faulty logic combinations are taken into consideration, the reality in a deep-submicron LSI circuit is better reflected, which contributes to the improvement of diagnostic resolution.

13 Claims, 9 Drawing Sheets

U.S. PATENT DOCUMENTS

| | | |
|---|---|---|
| 7,065,690 B1 | 6/2006 | Yoshida et al. |
| 7,102,227 B2 * | 9/2006 | Terui ............................ 257/724 |
| 7,352,170 B2 * | 4/2008 | Heaberlin ................ 324/762.02 |
| 7,478,295 B2 * | 1/2009 | Wen et al. ...................... 714/724 |
| 7,689,878 B2 * | 3/2010 | Azimane ....................... 714/718 |
| 7,770,080 B2 * | 8/2010 | Blanton et al. ................ 714/723 |
| 2004/0205681 A1 | 10/2004 | Nozuyama |
| 2006/0107157 A1 | 5/2006 | Wen et al. |
| 2006/0156095 A1 | 7/2006 | Yoshida et al. |
| 2006/0236184 A1 | 10/2006 | Yoshida et al. |

* cited by examiner

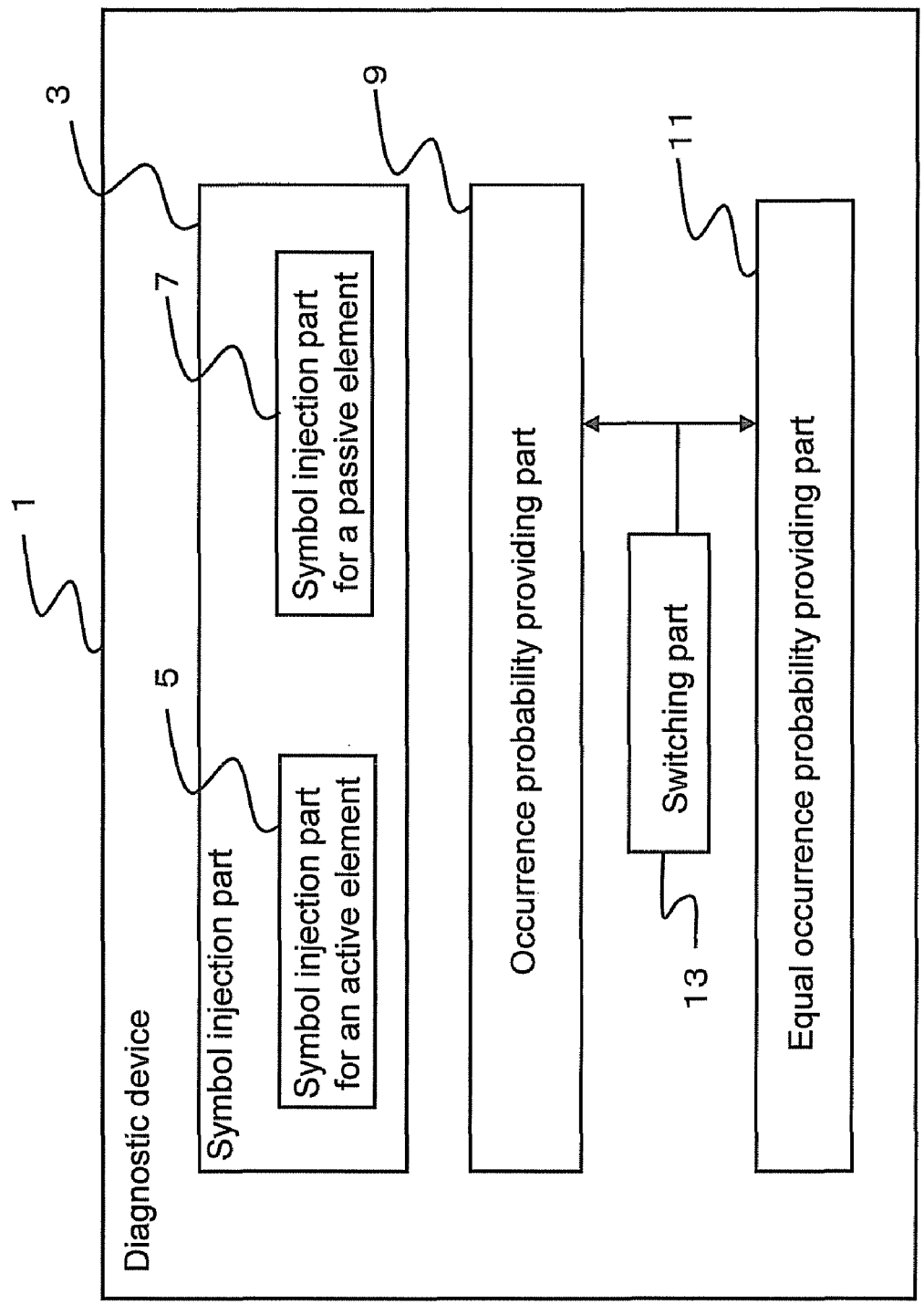
[Fig. 1]

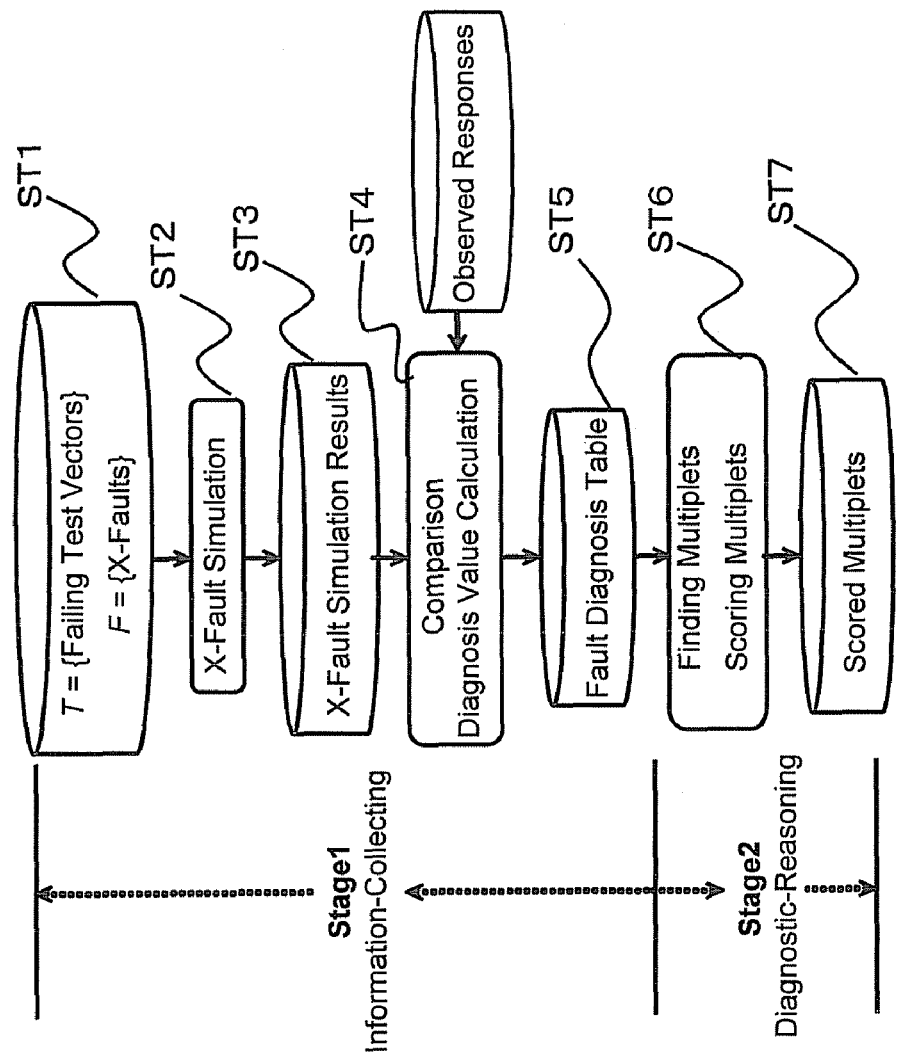
[Fig.2]

[Fig.3]
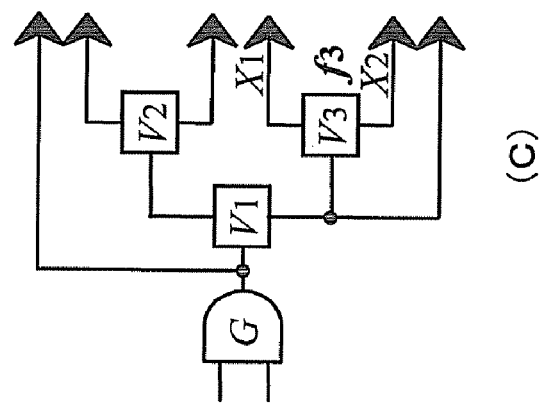
(C)
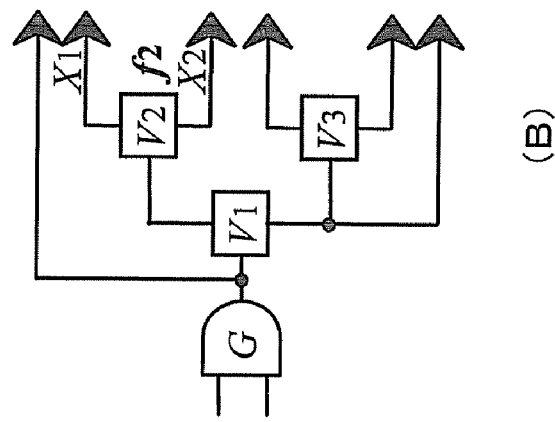
(B)
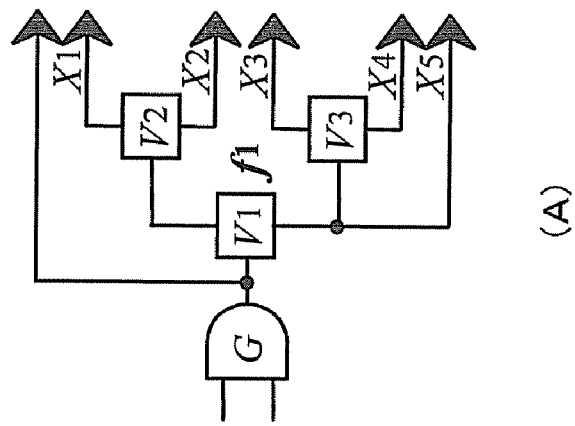
(A)

[Fig. 4]
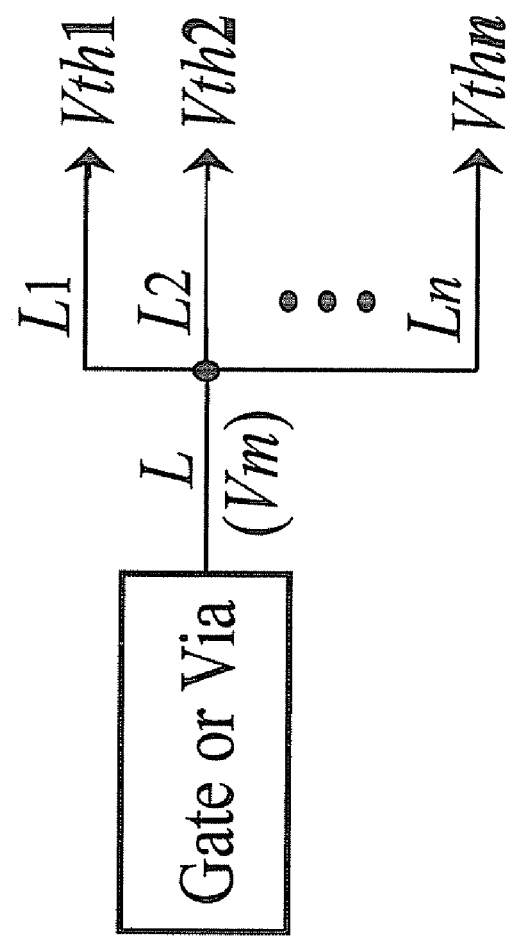

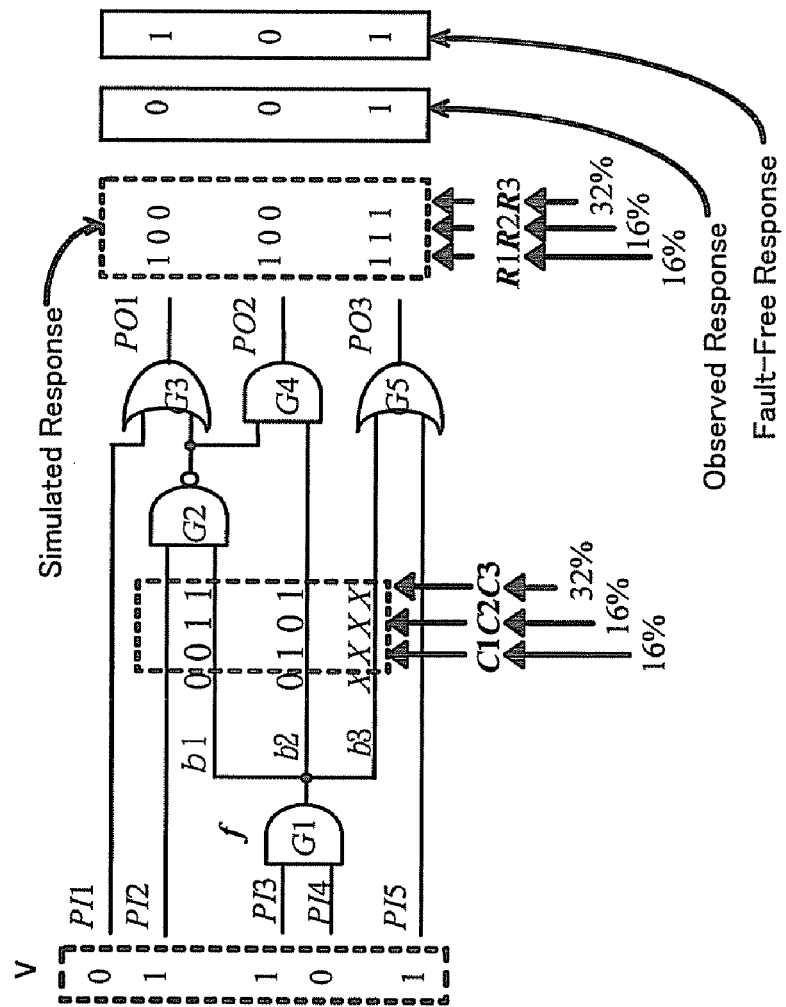
[Fig.5]

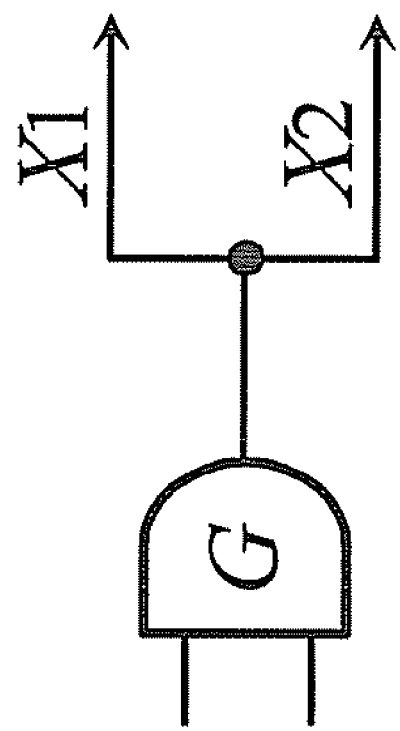
[Fig.6]

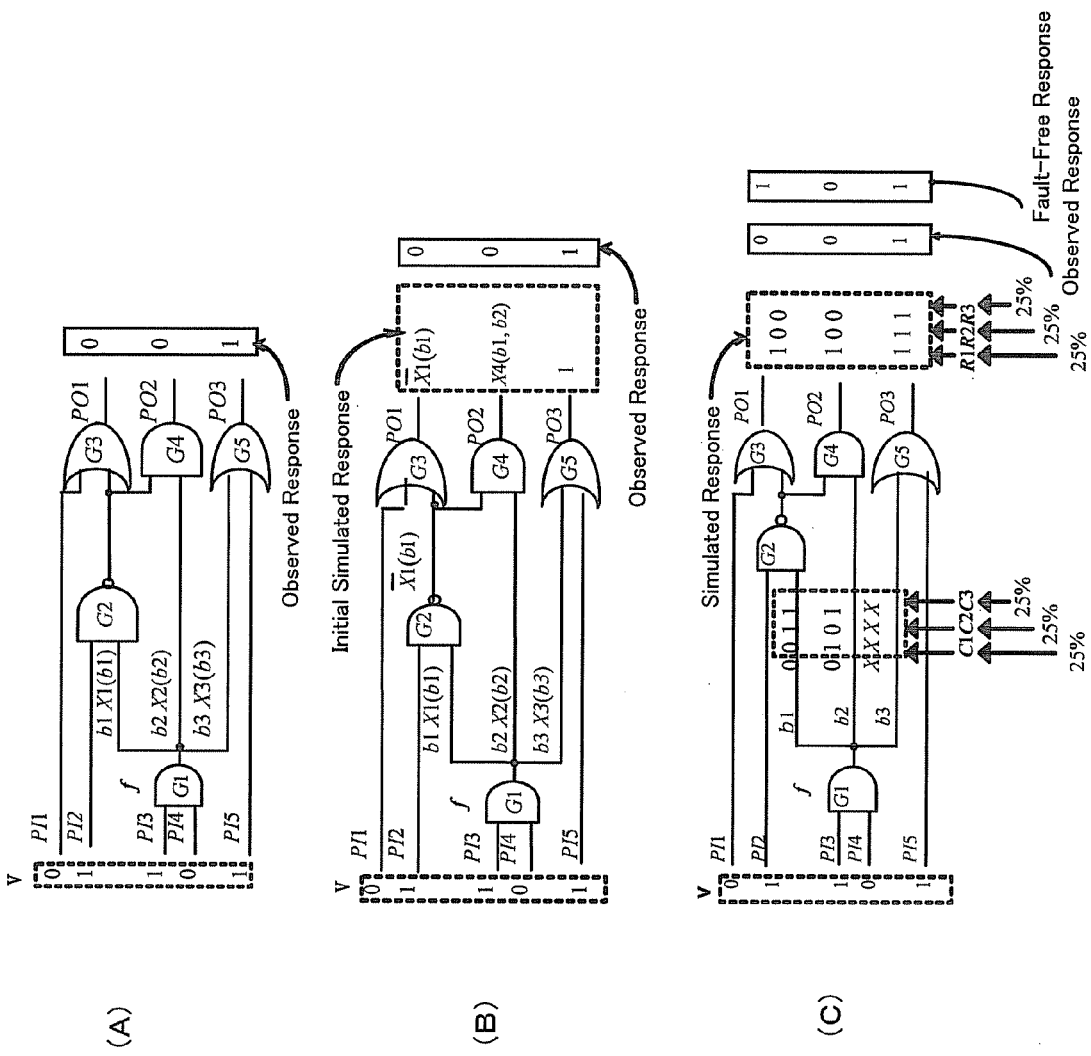
[Fig.7]

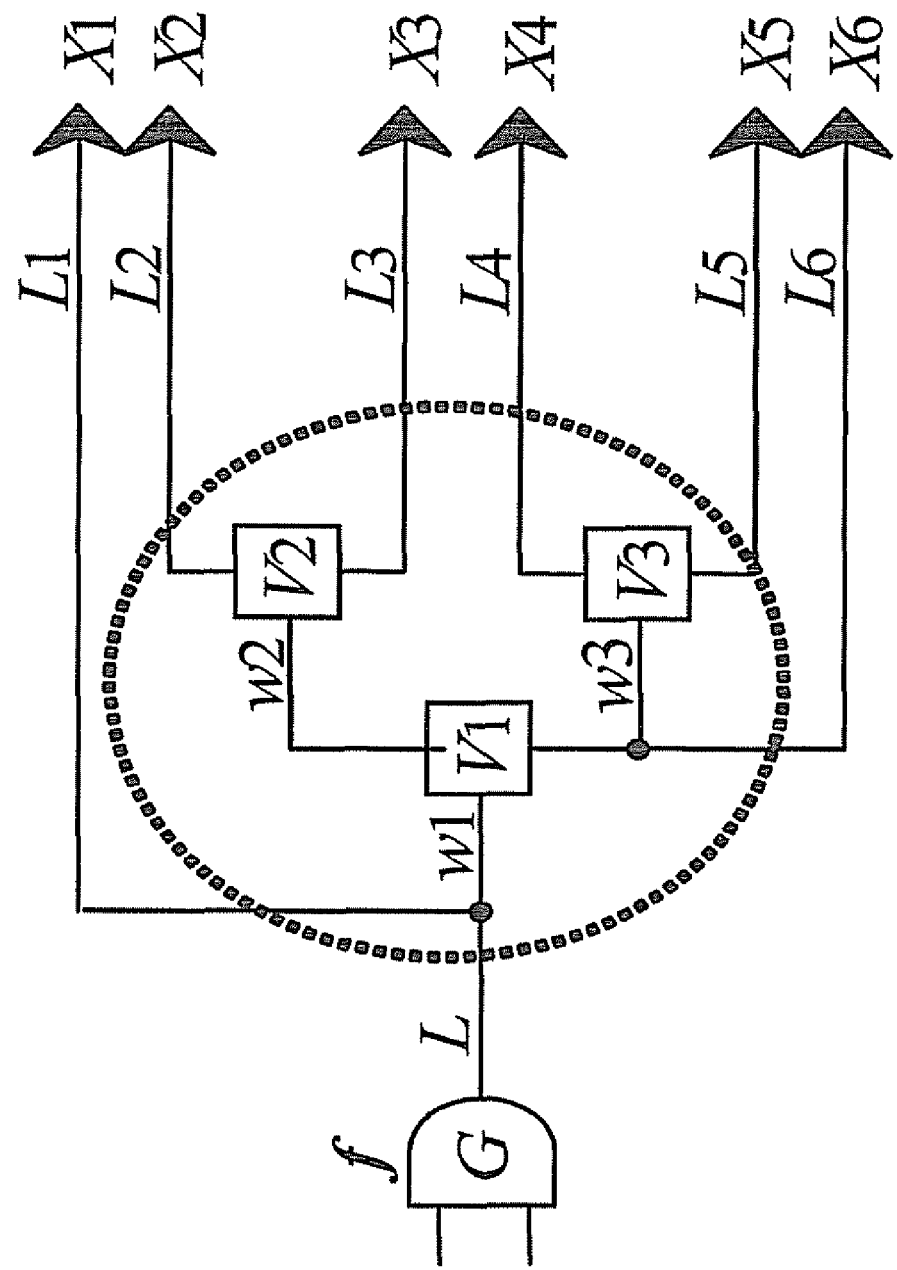
[Fig. 8]

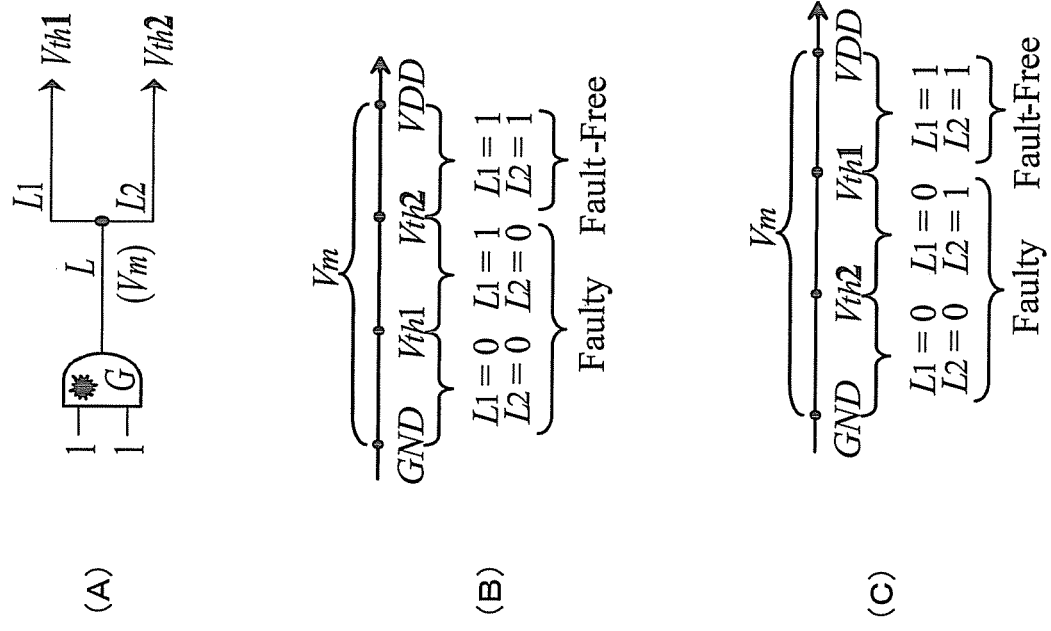
[Fig.9]

DIAGNOSTIC DEVICE, DIAGNOSTIC METHOD, PROGRAM, AND RECORDING MEDIUM

TECHNICAL FIELD

The present invention relates to a diagnostic device, a diagnostic method, a program capable of causing a computer to execute the diagnostic method, and a recording medium recording the program. More specifically, the present invention relates to a diagnostic device and the like for diagnosing a fault in a logic circuit of semiconductor equipment.

BACKGROUND ART

Fault diagnosis is the most widely used approach to help localize physical defects in a failing LSI circuit. In fault diagnosis, a fault model in an abstract circuit model (usually a gate-level netlist) is used to represent the logical behavior of physical defects in an actual LSI circuit. A fault is considered responsible if the simulated response of the fault in the circuit model matches the observed response of the failing circuit under certain criteria used in a fault diagnosis procedure. The locations of physical defects are then identified with the assist of the information on such responsible faults. Clearly, a good fault model and a good diagnosis procedure are needed in order to obtain sufficient resolution in fault diagnosis.

A good fault model for fault diagnosis needs to closely resemble underlying physical defects from two attributes: location and logical behavior. In a gate-level circuit model, the first attribute means one or more nets or pins, and the second attribute means one or more logic values. Fault modeling defines these attributes in a general manner. On the other hand, physical defects can be characterized from three aspects: complexity (simple or complex), temporality (static or dynamic), and cardinality (single or multiple), as described below. A simple defect forces logic value of a single defect position to fix 0 or 1. On the other hand, a complex defect, like a resistive short or open defect, causes a plurality of possible influences around a defect position. A static defect shows the same behavior for all the input vectors, while a dynamic defect shows different behaviors for different input vectors. There may be a single or multiple defects in a circuit.

The defect complexity issue has been addressed by using a set of simple fault models or by using a realistic fault model. For example, there is a case in which four fault models are used to cover various defects. On the other hand, various realistic fault models, such as stuck-open, bridging, transistor leakage, and Byzantine, better reflect actual defect mechanisms. In general, an indirect approach suffers from insufficient diagnosis accuracy and a direct approach suffers from increasing its fault simulation cost.

Recently, the inventor proposed a new realistic fault model, called the X-fault model, for modeling complex defects, especially those with unpredictable and nondeterministic logic behavior (Non-Patent Document 1, 2, Patent Document 1). The X-fault model represents all possible faulty logic behavior of a physical defect or defects in a gate and/or on its fanout branches by using different X symbols assigned onto the fanout branches. This makes the X-fault model highly accurate since no defect information is lost in fault modeling. In addition, partial symbolic fault simulation, instead of full symbolic fault simulation, is used in X-fault simulation in order to achieve high efficiency in terms of computing time. Since an ever-increasing physical defects in deep-submicron LSI circuits manifest themselves by unpredictable and non-deterministic logic behavior, using the X-fault model in fault diagnosis is becoming more and more advantageous.

Per-test fault diagnosis is gaining popularity as an effective approach to handle the cardinality and temporality issues of complex defects. The basic idea is to process failing test vectors separately, one at a time, in fault diagnosis, based on the observation that only one of the multiple defects in an LSI circuit may be activated by one failing test vector in some cases. This allows a single fault model to be assumed for the activated defect and a relatively easy fault diagnosis procedure based on single fault simulation to be used for multiple and/or dynamic defects. That is, per-test fault diagnosis is effective to solve both of the cardinality problem and temporality problem simultaneously.

Several per-test fault diagnosis methods have already been proposed. The single stuck-at fault model, and a combination of stuck-at, stuck-open, net, and bridging faults are used. These methods attempt to find a minimal set of faults that explains as many failing vectors as possible. Such a fault set is called a multiplet. In addition, some method calculates a score for a fault depending on the number of failing vectors explained by the fault, and another method further extracts diagnostic information from multiplets, while yet another method scores each multiplet based on probability functions.

Recently, a per-test fault diagnosis method based on the X-fault model has been proposed. On top of the accuracy achieved by X-fault modeling, this fault diagnosis procedure employs a flexible matching criterion that takes matching details into consideration. The detailed diagnostic information extracted from the relation between an observed response and a simulated response is expressed as a diagnosis value for each X-fault and each failing test vector, and all diagnosis values form a diagnosis table, from which multiplets are obtained and ordered. It has been shown that such per-test X-fault diagnosis can achieve high diagnostic resolution for complex, multiple, and/or dynamic defects.

The following is the specific explanation of the conventional per-test fault diagnosis method, which is also shown in Patent Document 1.

Firstly, the conventional X-fault model is defined as follows.

Definition 1: A fanout gate has one X-fault, corresponding to any physical defect or defects in the gate or on its n fanout branches. The X-fault assumes n different X symbols on the n fanout branches to represent all possible faulty logic values in fault simulation.

FIG. 6 shows the X-fault for an AND gate with two fanout branches.

X1 and X2 denote two arbitrary faulty logic values. Clearly, <X1, X2> represents any possible faulty logic combination that may appear on the fanout branches. Note that the conventional X-fault model treats all fanout branches as directly connected signal lines, without considering that vias may exist at fanout branches.

X-fault simulation is explained in the following. Given an X-fault f and an input vector v, X-fault simulation is to obtain the simulated response of f under v, denoted by SimRes(f, v)={R1, R2, ..., Rk}, where R1, R2, ..., Rk ($k \geq 1$) are logic combinations at primary outputs, corresponding to k possible faulty logic combinations, C1, C2, ..., Ck, at the site of f, respectively. Generally, X-fault simulation uses a partial-symbolic procedure, consisting of three steps. That is, (1) X-injection for assigning different X symbols to the fanout branches of a gate, (2) X-propagation for propagating X symbols to primary outputs, and (3) X-resolution for resolving all X symbols at primary outputs to obtain a final simulation result.

FIG. 7. explains X-injection, X-propagation, and X-resolution.

In FIG. 7 (A), X-injection assigns 3 initial X symbols, X1(b1), X2(b2), and X3(b3), to the fanout branches, b1, b2, and b3 of the gate G1, respectively. In FIG. 7 (B), X-propagation is conducted by keeping inversion information but ignoring all other logic functions. For example, the output of the gate G4 is the AND function of X1 (b1) and X2(b2). This functional information is ignored and the result is a new X symbol X4(b1, b2), in which (b1, b2) is used to indicate that the output of G4 only comes from branches b1 and b2. In FIG. 7 (C), X-resolution is conducted to remove the ambiguity due to X symbols existing in the initial simulated response. Since b3 is not responsible, only three possible faulty logic combinations, C1, C2, and C3, need to be considered at the fault site. As a result, the final simulated responses is SimRes(f, v)={R1, R2, R3}, where R1, R2, and R3 correspond to C1, C2, and C3, respectively. Note that in the conventional X-fault simulation procedure, C1, C2, and C3 are assumed to be equivalent, i.e. each of them has an occurrence probability of 25%.

Diagnosis value calculation will be explained in the following. The failing vector v, the simulated response SimRes (f, v)={R1, R2, . . . , Rk} needs to be compared with the observed response ObvRes(v) to extract diagnostic information. The comparison result is represented by a so-called diagnosis value under v and f, denoted by d(f, v), and the conventional method to calculate d(f, v) is as follows.

$$d(f, v, Ri) = \frac{Level(f)}{Lmax} \times \frac{|Error\_PO(v) \cap Reach\_PO(f)|}{|Reach\_PO(f)|} \quad \text{Formula 1}$$

if Ri is the same as ObvRes(v) on Reach_PO(f); otherwise, d(f, v, Ri)=0. And, $$d(f, v) = \left(\sum_{i=1}^{k} d(f, v, Ri)\right) / k$$

Here, Error_PO(v) is the set of all primary outputs on which an observed response has errors, and Reach_PO(f) is the set of primary outputs that is reachable from the gate with the X-fault f. In FIG. 7 (C), Error_PO(v)={PO1} and Reach_PO(f)={PO1, PO2, PO3}. Moreover, Level(f) is the level of the output of the gate with the X-fault f, and Lmax is the maximum level in the circuit, assuming that all primary outputs have level 1. In FIG. 7, Level(f)=3 and Lmax=3.

For the X-fault simulation result shown in FIG. 7 (C), SimRes(f, v)={R1, R2, R3}={<111>, <001>, <001>}, ObvRes(v)=<001>, and the fault-free simulation result is <101>. Clearly, d(f, v, R1)=0 and d(f, v, R2)=d(f, v, R3)=(3/3)□. (1/3)=0.33. Therefore, d(f, v)=(0+0.33+0.33)/3=0.22.

Diagnosis values are calculated for all failing test vectors and faults, and they are stored in a table called a fault diagnosis table, as illustrated in Table 1. Clearly, compared with a normal fault dictionary with only 0 and 1 entries, a fault diagnosis table contains more diagnostic information. It is obvious that diagnosis values are calculated with unique matching criteria, which take the reachable range of primary outputs, the number of matched errors, and the depth of a fault into consideration.

TABLE 1

|     | f1   | f2   | f3   | f4   | f5   |
|-----|------|------|------|------|------|
| v1  | 0.81 | 0.65 | 0    | 0    | 0    |
| v2  | 0    | 0    | 0.61 | 0.17 | 0    |
| v3  | 0.26 | 0    | 0.83 | 0    | 0    |
| v4  | 0    | 0    | 0    | 0    | 0.55 |
| ave | 0.27 | 0.16 | 0.36 | 0.04 | 0.14 |

Non-Patent Document 1: X. Wen, T. Miyoshi, S. Kajiihara, L.-T. Wang, K. K. Saluja, and K. Kinoshita, "On Per-Test Fault Diagnosis Using the X-Fault Model", Proc. Int'l Conf. on Computer-Aided Design, pp. 633-640, 2004.

Non-Patent Document 2: X. Wen, H. Tamamoto, K. K. Saluja, and K. Kinoshita, "Fault Diagnosis for Physical Defects of Unknown Behaviors", Proc. Asian Test Symp., pp. 236-241, 2003.

Patent Document 1: Japanese Unexamined Patent Application Publication No. 2006-118903

DISCLOSURE OF THE INVENTION

Problems to be Solved by the Invention

However, the conventional per-test X-fault diagnosis method faces two serious problems, as described below.

FIG. 8 shows a diagram to explain the first problem of conventional per-test X-fault diagnosis method.

Problem 1: The existence of vias is not considered in relation to fanout branches. In the conventional X-fault model, the existence of vias is ignored. Via itself is a passive element and connection means which is necessary in a multi-layered circuit. Calculations are not conducted in a via, which is a reason why a fault in a via has been theoretically rarely taken into consideration. However, the layout of a deep-submicron LSI circuit usually involves multiple layers, which means that vias are so extensively used that the influence of vias on defects cannot be ignored. Concretely speaking, the fanout branches from gates are focused in conventional approaches. This is illustrated in FIG. 8, where the gate G is considered to have 6 fanout branches, L1~L6. That is, 6 X symbols, X1~X6, need to be assigned to L1~L6, respectively. In reality, however, 3 vias, V1~V3, may exist as shown in FIG. 8. Ignorance of existence of vias cause the increase of number of fanout branches in error. As the result, it would take a longer time for X-fault simulation. Since X-fault diagnosis cannot identify defective fanout branches, treating many lines as fanout branches from the same gate may reduce diagnostic resolution.

FIG. 9 shows a diagram to explain the second problem of conventional per-test X-fault diagnosis method.

Problem 2: Difference in occurrence probabilities of possible logic behavior of a physical defect is ignored. In the conventional X-fault diagnosis procedure, all possible logic combinations at the fanout branches of a gate are considered to be the same. In reality, however, this is usually not true. This is illustrated in FIG. 9 (A), where the gate G has a defective voltage Vm, which may be intermediate. In FIG. 9 (A), the gate G has two fanout branches, L1 and L2, corresponding to threshold voltages Vth1 and Vth2, respectively. In Case-1 (Vth1<Vth2), <00>, <10>, and <11> may occur at L1 and L2. Here, 'Faulty' denotes a faulty circuit, and 'Fault-Free' denotes a normal circuit. As shown in FIG. 9 (B), in Case-1 (Vth1<Vth2), the possible combination of voltages at L1 and L2 are <00>, <10>, and <11>. However, as described in FIG. 9 (C), in Case-2 (Vth1>Vth2), <00>, <01>, and <11> may occur at L1 and L2. In a deep-submicron LSI circuit, especially with low-voltage design, the order relation between Vth1 and Vth2 may be unpredictable due to process variation. That is, both Case-1 and Case-2 may show up. Under this condition, it is clear that the occurrence probabilities of <00>, <10>, <01>, and <11> are ⅔, ⅙, ⅙, and ⅔, respectively, which are clearly not equal. Therefore, treating the occurrence probabilities of all logic combinations at the fanout branches of a gate as equal in an X-fault diagnosis procedure may either reduce diagnostic resolution or produce misleading diagnostic results.

It is, therefore, an object of the present invention to provide a diagnostic device and the like to improve diagnostic resolution and diagnosis results.

Means for Solving the Problems

A first aspect in accordance with the present invention provides a diagnosis device for diagnosing logical behavior of a physical defect in a logic circuit by representing the logical behavior with different distinction symbols assigned onto fanout branches, an active element of the logic circuit being connected to one or a plurality of passive elements, the diagnosis device comprising symbol injection means for a passive element for assigning distinction symbols, which represent logical behaviors of one or a plurality of defects existing in the passive element and/or in each of a plurality of signal lines from fanout branches which can propagate output signals of the passive element, to each of a plurality of signal lines from fanout branches which can propagate output signals of the passive element, and fault locating means for locating a fault which occurred in the passive element by making use of distinction symbols assigned by the symbol injection means for a passive element.

A second aspect in accordance with the present invention provides a diagnosis device for diagnosing a fault in a multi-layered logic circuit, an active element of the logic circuit being connected between different layers and to one or a plurality of passive elements, the diagnosis device comprising symbol injection means for a passive element for assigning distinction symbols, which represent logical behaviors of one or a plurality of defects existing in the passive element and/or in each of a plurality of signal lines from fanout branches which can propagate output signals of the passive element, to each of a plurality of signal lines from fanout branches which can propagate output signals of the passive element, and fault locating means for locating a fault which occurred in the passive element with a distinction symbol assigned by the symbol injection means for a passive element.

A third aspect in accordance with the present invention provides the diagnosis device according to the second aspect, wherein the passive element includes a connection element for connecting an active element in the logic circuit between different layers.

A fourth aspect in accordance with the present invention provides the diagnosis device according to the first aspect, further comprising symbol injection means for an active element for assigning distinction symbols, which represent logical behaviors of one or a plurality of defects existing in the active element and/or in each of a plurality of signal lines from fanout branches which can propagate output signals of the active element, to each of a plurality of signal lines from fanout branches which can propagate output signals of the active element, wherein the fault locating means also locates a fault which occurred in the active element by making use of distinction symbols assigned by the symbol injection means for an active element.

A fifth aspect in accordance with the present invention provides the diagnosis device according to the fourth aspect, further comprising occurrence probability providing means for calculating, for each possible faulty logic combination at a plurality of signal lines from fanout branches which can propagate output signals of the active element or the passive element, an occurrence probability which is based on relationship between voltage of the active element or the passive element and threshold voltage of each of a plurality of signal lines from the fanout branches and which are not equal for the whole faulty logic combination.

A sixth aspect in accordance with the present invention provides a diagnosis device for diagnosing a fault in a logic circuit of semiconductor equipment, comprising occurrence probability providing means for calculating, for each possible faulty logic combination at a plurality of signal lines from fanout branches which can propagate output signals of an active element or a passive element, an occurrence probability which is based on relationship between voltage of the active element or the passive element and threshold voltage of each of a plurality of signal lines from the fanout branches and which are not equal for the whole faulty logic combination.

A seventh aspect in accordance with the present invention provides the diagnosis device according to claim 6, further comprising equal occurrence probability providing means for calculating, for each possible faulty logic combination at a plurality of signal lines from fanout branches which can propagate output signals of an active element or a passive element, an occurrence probability which is equal for the whole faulty logic combination, and switching means for switching, in response to selection instruction by a user, between the occurrence probability providing means and the equal occurrence probability providing means.

An eighth aspect in accordance with the present invention provides a diagnosis method for diagnosing logical behavior of a physical defect in a logic circuit by representing the logical behavior with different distinction symbols assigned onto fanout branches, an active element of the logic circuit being connected to one or a plurality of passive elements, the diagnosis method comprising steps of causing symbol injection means to assign distinction symbols, which represent logical behaviors of one or a plurality of defects existing in the active element and/or in each of a plurality of signal lines from fanout branches which can propagate output signals of the active element, to each of a plurality of signal lines from fanout branches which can propagate output signals of the active element, and to assign distinction symbols, which represent logical behaviors of one or a plurality of defects existing in the passive element and/or in each of a plurality of signal lines from fanout branches which can propagate output signals of the passive element, to each of a plurality of signal lines from fanout branches which can propagate output signals of the passive element, and causing fault locating means to locate a fault which occurred in the active element or the passive element by making use of distinction symbols assigned by the symbol injection means.

A ninth aspect in accordance with the present invention provides a diagnosis method for diagnosing logical behavior of a physical defect in a logic circuit by representing the logical behavior with different distinction symbols assigned onto fanout branches, an active element of the logic circuit being connected to one or a plurality of passive element, the diagnosis method comprising steps of causing symbol injection means for a passive element to assign distinction symbols, which represent logical behaviors of one or a plurality of defects existing in the passive element and/or in each of a plurality of signal lines from fanout branches which can propagate output signals of the passive element, to each of a plurality of signal lines from fanout branches which can propagate output signals of the passive element, and causing fault locating means for a passive element to locate a fault which occurred in the passive element by making use of distinction symbols assigned by the symbol injection means for a passive element.

A tenth aspect in accordance with the present invention provides the diagnosis method according to claim 8, further comprising a step of causing occurrence probability providing means to calculate, for each possible faulty logic combination at a plurality of signal lines from fanout branches which can propagate output signals of the active element or the passive element, an occurrence probability which is based on relationship between voltage of the active element or the passive element and threshold voltage of each of a plurality of signal lines from the fanout branches and which are not equal for the whole faulty logic combination.

An eleventh aspect in accordance with the present invention provides a diagnosis method for diagnosing a fault in a logic circuit, comprising a step of causing occurrence probability providing means to calculate, for each possible faulty logic combination at a plurality of signal lines from fanout branches which can propagate output signals of the active element or the passive element, an occurrence probability which is based on relationship between voltage of the active element or the passive element and threshold voltage of each of a plurality of signal lines from the fanout branches and which are not equal for the whole faulty logic combination.

A twelfth aspect in accordance with the present invention provides a program capable of causing a computer to execute the diagnosis method according to any of claim 8 through 11.

A thirteenth aspect in accordance with the present invention provides a recording medium recording the program according to claim 12 so as to be able to cause a computer to execute the program.

EFFECT OF THE INVENTION

According to the present invention, by locating even a fault caused by a defect related to a passive element like a via, which results in more segmented locations of faults, it is possible to improve diagnostic resolution, to decrease diagnosis time, and to improve diagnosis results. Additionally, since all of so-called occurrence probabilities of faulty logic combinations are not assumed to be equivalent, it is possible to diagnose a fault with taking the relation between an intermediate voltage and a plurality of threshold voltages in a real circuit into consideration. That results in increasing yield, improving processes, and more reliability.

PREFERRED EMBODIMENT OF THE INVENTION

FIG. 1 shows a schematic block diagram of main components of an example of a diagnostic device in accordance with an embodiment of the present invention. FIG. 2 shows a flow diagram of per-test X-fault diagnosis, which is a foundation for a diagnostic device in FIG. 1 to work.

In FIG. 1, the diagnostic device 1 includes a symbol injection part 3, and the symbol injection part 3 includes a symbol injection part for an active element 5 and a symbol injection part for a passive element 7. The diagnostic device 1 includes an occurrence probability providing part 9, an equal occurrence probability providing part 11, and a switching part 13.

How each component works will be described in detail later and the process of per-test X-fault diagnosis is described here in FIG. 2.

The per-test X-fault diagnosis flow, which consists of two stages, one for collecting diagnostic information and the other for drawing diagnostic conclusion. In Stage-1 (Information-Collecting), all X-faults are simulated for each failing vector (ST1 and ST2), the simulated responses are compared with observed responses, and a diagnosis table is created (ST3, ST4, and ST5). In Stage-2 (Diagnostic-Reasoning), a diagnosis result is produced from the fault diagnosis table. The basic processing is to find a minimal set of X-faults that cover all failing vectors corresponding to non-all-zero rows in a fault diagnosis table. Such a fault set is called a multiplet. Then, the score of each multiplet is calculated by adding up the diagnosis values of all composing X-faults (ST6 and ST7). These scores are then used to determine the order of multiplets, and the X-faults in top multiplets form the final fault diagnosis result.

The general flow of the improved per-test X-fault diagnosis is basically the same with the conventional flow, in consisting of two stages. The differences are described in detail in the following. As described above, the layout of a deep-submicron LSI circuit usually needs to involve multiple layers, which means that vias are extensively used. Since via information is utilized, it becomes possible to locate defects to the via level, greatly improving the diagnostic resolution. In addition, since the number of fanout branches from a gate or a via becomes smaller, the time for X-resolution also becomes shorter. Moreover, since a new diagnosis value is used and, the occurrence probabilities of possible faulty logic combinations are taken into consideration, the reality in a deep-submicron LSI circuit is better reflected, which contributes to the improvement of diagnostic resolution.

A definition is introduced as follows to treat the information of vias.

Definition 2: A fanout element (gate or via) has one X-fault, corresponding to any physical defect or defects in the element or on its fanout branches. The X-fault assumes different X symbols on the fanout branches of the element to represent non-deterministic faulty logic values in fault simulation.

Examples of the extended X-fault model, which introduced the above definition, are shown in FIG. 3.

Since there are three vias V1~V3, 3 extended X-faults, f1~f3, are added, in addition to the conventional X-fault f shown in FIG. 8. 5, 2, and 2 different X symbols are assumed for the three extended X-faults, f1, f2, and f3, respectively. Obviously, these new added X-faults are all different from the conventional X-fault f shown in FIG. 8. The most significant advantage of the extended X-fault model is that it can locate defects to the via level, which greatly improves the diagnostic resolution. In the case of FIG. 3, diagnostic results now can be obtained with respect to V1, V2, and V3, instead of only G. The symbol injection part for a passive element 7 injects symbols to passive elements like vias, and the symbol injection part for an active element 5 injects symbols to active elements like logic gates.

Next, suppose that a gate or via has n fanout branches, L1, L2, ..., and Ln, whose corresponding threshold voltages are Vth1, Vth2, ..., and Vthn, respectively. If the order of Vth1, Vth2, ..., and Vthn is fixed and known, there will be exactly n+1 possible logic combinations at the fanout branches. In a real LSI circuit, however, process variation in the deep sub-micron era and shrinking difference among threshold voltages in low-voltage design increasingly make it difficult to deterministically know the order of threshold voltages corresponding to the fanout branches of a gate or via. In other words, it is necessary to consider all possible orders of threshold voltages at the fanout branches. As illustrated in FIG. 9, this results in different occurrence probabilities of logic combinations at the fanout branches of a gate or via. This phenomenon can be quantitatively expressed by the following theorem.

Theorem 1: For a gate or via with n fanout branches, the total number of possible orders of threshold voltages at the fanout branches is n! In addition, the probability that the fanout branches have a logic combination with p 0's ($0 \leq p \leq n$) is $(p! \times (n-p)!)/(n+1)!$ Proof: Consider the general case shown in FIG. 4. Here, a gate or via has the n fanout branches, L1~Ln, whose corresponding threshold voltages are Vth1~Vthn, respectively. In addition, it is assumed that the stem L has a non-deterministic voltage Vm. Depending on the relations of L with Vth1~Vthn, different logic combinations may appear on L1~Ln.

1st Half: When n threshold voltages are ordered, there are n choices for the first threshold voltage, (n−1) choices for the second threshold voltage, . . . , and 1 choice for the n-th threshold voltage. As a result, there are a total of n! possible orders of n threshold voltages.

2nd Half: First, for each order of n threshold voltages, there are (n+1) possible logic combinations, depending on which of the (n+1) voltage intervals in the order the corresponding intermediate voltage Vm falls in. That is, the total number of occurrences of possible logic combinations is $(n+1) \times n! = (n+1)!$. In addition, a logic combination having p 0's ($0 \leq p \leq n$) means that p threshold voltages are lower than Vm and (n−p) threshold voltages are higher than Vm, where Vm is the corresponding intermediate voltage. As a result, there are $p! \times (n-p)!$ logic combination with p 0's. Therefore, the occurrence probability of such a logic combination is $(p! \times (n-p)!)/(n+1)!$.

The occurrence probabilities of logic combinations at n fanout branches are summarized in Table 2, and the special case of n=3 is shown in Table 3. Clearly, logic combinations with different numbers of 0's may have different occurrence probabilities.

TABLE 2

| Number of 0's in logic combination | Number of Occurrences | Probability of Occurrence |
| --- | --- | --- |
| 0 | n! | 1/(n + 1) |
| 1 | 1! × (n − 1)! | 1/(n × (n + 1)) |
| 2 | 2! × (n − 2)! | 2/((n − 1) × n × (n + 1)) |
| . | . | . |
| . | . | . |
| . | . | . |
| p | p! × (n − p)! | (p! × (n − p)!)/(n + 1)! |
| . | . | . |
| . | . | . |
| . | . | . |
| n | n! | 1/(n + 1) |

TABLE 3

| Number of 0's in logic combination | Number of Occurrences | Probability of Occurrence |
| --- | --- | --- |
| 0 | 6 | 25% |
| 1 | 2 | ≈8% |
| 2 | 2 | ≈8% |
| 3 | 6 | 25% |

Next, how the occurrence probability providing part 9 in FIG. 1 works is explained. Based on Theorem 1, one can determine the occurrence probabilities for all possible faulty logic combinations at the fanout branches of a gate or via. This information is used in X-resolution during X-fault simulation, in order to better reflect the reality in deep-submicron LSI circuits.

Consider the X-resolution example shown in FIG. 5 for simulating the X-fault at the same gate G with that of FIG. 7.

This gate has 3 fanout branches, b1, b2, and b3, and there are 3 possible faulty logic combinations, C1=<01X>, C2=<10X>, and C3=<11X>. Since C1 represents <010> and <011> that both have the occurrence probability of 8%, the occurrence probability of C1 is 16%. Similarly, the occurrence probabilities of C2 and C3 can be obtained as 16% and 32%, respectively. As a result, the occurrence probabilities of C1, C2, and C3 are 16%, 16%, and 32%, respectively, which are different from the conventional assumption that all of them have the same occurrence probability of 25% as shown in FIG. 7 (C).

Suppose that the possible logic combinations at the fanout branches for X-fault f under test vector v are C1, C2, . . . Cn, whose occurrence probabilities are p(C1), p(C2) . . . , and p(Cn), respectively. Note that p(C1), p(C2) . . . , and p(Cn) can be readily calculated by using Theorem 1. Also suppose that the simulated response SimRes(f, v) {R1, R2, . . . , Rn}, where R1, R2, . . . , and Rn are resulting logic combinations at primary outputs, corresponding to C1~Cn, respectively. Clearly, the occurrence probabilities of R1, R2, . . . , and Rn, denoted by p(R1), p(R2) . . . , and p(Rn), respectively, are equal to p(C1), p(C2) . . . , and p(Cn), respectively. For example, in FIG. 5, since the occurrence probabilities of logic combinations at fanout branches, C1, C2, and C3, are 16%, 16%, and 32%, respectively, the occurrence probabilities of logic combinations at primary outputs, R1, R2, and R3 are also 16%, 16%, and 32%, respectively.

In the conventional definition of diagnosis value, it is assumed that all possible faulty logic combinations at the fanout branches of a gate are equivalent, which may not be true in reality. In the following, a new definition of diagnosis value is presented to take the difference in occurrence probabilities into consideration.

Generally, the simulated response SimRes(f, v)={R1, R2, . . . , Rk} is compared with the observed response ObvRes(v) to extract diagnostic information, and the comparison result is represented by a diagnosis value under v and f, denoted by d(f, v), and the new method to calculate d(f, v) is as follows.

$$d(f, v, Ri) = \frac{Level(f)}{Lmax} \times \frac{|Error\_PO(v) \cap Reach\_PO(f)|}{|Reach\_PO(f)|} \quad \text{Formula 2}$$

if Ri is the same as ObvRes(v) on Reach_PO(f); otherwise, d(f, v, Ri)=0. And, $$d(f, v) = \sum_{i=1}^{k} (d(f, v, Ri) \times p(Ri))$$

Here, Error_PO(v), Reach_PO(f), Level(f), and Lmax are all as defined as described above. In FIG. 5, for example, SimRes(f, v)={R1, R2, R3}={<111>, <001>, <001>}, ObvRes(v)=<001>, and the fault-free simulation result is <101>. Thus, d(f, v, R1)=0, d(f, v, R2)=d(f, v, R3)=(3/3)×(1/3)=0.33. Therefore, d(f, v)=0×0.16%+0.33×0.16%+0.33×0.25%=0.14. Clearly, this diagnosis value is different from the diagnosis value 0.22 calculated in FIG. 7 (C).

Next, experimental results are described. Table 4 summarizes the experimental results.

TABLE 4

| Circuit | Vector (#) | SLAT (#) | MPLT (#) | Exact (%) | FH (#) | | | New-B Time (Sec.) |
|---|---|---|---|---|---|---|---|---|
| | | | | | Old | New-A | New-B | |
| C432 | 28 | 2.6 | 9.0 | 11.1 | 2.8 | 2.5 | 2.7 | 0.01 |
| C499 | 52 | 4.1 | 35.4 | 2.8 | 27.3 | 2.2 | 1.0 | 0.01 |
| C880 | 21 | 4.7 | 4.3 | 23.3 | 1.2 | 1.4 | 1.0 | 0.01 |
| C1355 | 84 | 8.0 | 40.1 | 2.5 | 9.0 | 1.2 | 1.0 | 0.15 |
| C1908 | 106 | 2.3 | 43.8 | 2.3 | 16.7 | 6.5 | 7.0 | 0.08 |
| C2670 | 45 | 21.4 | 5.4 | 18.5 | 1.3 | 3.6 | 1.9 | 0.34 |
| C3540 | 93 | 5.6 | 14.0 | 7.1 | 1.1 | 5.6 | 6.1 | 0.37 |
| C5315 | 46 | 9.9 | 19.2 | 4.7 | 1.5 | 4.9 | 5.4 | 0.60 |
| C6288 | 14 | 7.2 | 11.3 | 8.8 | 2.5 | 5.6 | 4.0 | 2.99 |
| C7552 | 75 | 20.2 | 48.2 | 2.1 | 4.8 | 5.4 | 3.9 | 2.45 |
| | | | | | 6.8 | 3.7 | 3.4 | |

The number of input vectors for each circuit is shown under "Vector". In each experiment, a via-open defect was randomly inserted at a fanout gate to imitate a defective chip, and the defect was assumed to cause faulty effects at multiple branches of the gate. 10 experiments were conducted for each circuit, and the average number of faulty fanout branches is 2.0.

For each sample, three per-test fault diagnosis programs were run: "OLD" uses the conventional X-fault model, "New-A" uses the extended X-fault model but the conventional method for diagnosis value calculation, and "New-B" uses the extended X-fault model and the proposed method for diagnosis value calculation. "SLAT" shows the average number of SLAT vectors for 10 samples. Here, SLAT is an abbreviation of single location at-a-time, which means a test vector to obtain an output response that matches the output response in case of detecting a single fault even if there exists a multiple physical defect. "MPLT" shows the average number of multiplets; and "Exact" shows the average percentage of exact diagnosis, i.e. a multiplet containing all inserted defects, both for 10 samples. "FH" (First Hit) shows the average position of the first exact diagnosis—producing multiplet in a multiplet list. "Time" shows the average run time of "New-B".

From the average FH results, it can be seen that 3.7 was obtained from "New-A," with via information taken into consideration, and that 3.4 was obtained from "New-B," with via information taken into consideration and the new diagnosis value method adopted. It is clear that the use of extended X-fault model is indeed effective. Furthermore, the use of occurrence probability in diagnosis value calculation can further improve FH.

Here, the diagnostic device 1 in FIG. 1 includes an equal occurrence probability providing part 11 and it is possible to switch between the occurrence probability providing part 9 and the equal occurrence probability providing part 11, according to user's request. But, in the present preferred embodiment, the equal occurrence probability providing part 11 works as is conventionally done and is not an essential component.

In the present preferred embodiment, via is an example of a passive element. But it is not restricted to via and can be any other thing, a resistance for example, as long as not being an active element.

In the embodiment of the present invention, the diagnostic device and the like can be generally applied in a LSI circuit regardless of circuit structure, kinds of clock pulse, number of clock pulses, and so on. That is, it can also be applied to a LSI circuit with a plurality of scan chains, a plurality of clock pulses which drive full-scan circuits. It can also be applied to a LSI circuit if the timing is different to capture a value from the combinational portion of a full-scan circuit into flip-flops.

BRIEF DESCRIPTION OF THE DRAWINGS

FIG. 1 shows a schematic block diagram of main components of an example of a diagnostic device in accordance with an embodiment of the present invention.

FIG. 2 shows a flow diagram of per-test X-fault diagnosis, which is a foundation for a diagnostic device in FIG. 1 to work.

FIG. 3 shows examples of the extended X-fault model, which introduced the definition.

FIG. 4 shows a general case where a gate or via has n fanout branches L1, L2, . . . , Ln, and the threshold voltages corresponding to the fanout branches are Vth1, Vth2, . . . , Vthn, respectively.

FIG. 5 explains an example of X-resolution for considering the occurrence probabilities in simulating the X-fault at the same gate G with that of FIG. 7.

FIG. 6 shows an example of the X-fault for an AND gate with two fanout branches.

FIG. 7 explains X-injection, X-propagation, and X-resolution.

FIG. 8 explains the first problem of conventional per-test X-fault diagnosis method.

FIG. 9 explains the second problem of conventional per-test X-fault diagnosis method.

DESCRIPTION OF REFERENCE SYMBOLS

1 Diagnostic device
3 Symbol injection part
5 Symbol injection part for an active element
7 Symbol injection part for a passive element
9 Occurrence probability providing part
11 Equal occurrence probability providing part
13 Switching part

What is claimed is:

1. A diagnosis device for diagnosing a fault location of logical behavior caused by a physical defect existing in a multi-layered logic circuit, by representing the logical behavior with different distinction symbols assigned onto fanout branches,
an active element of the logic circuit being connected between different layers and to one or a plurality of passive elements,
the passive element including a connection element for connecting active elements in the logic circuit between different layers,
the diagnosis device comprising:
symbol injection means for an active element for assigning distinction symbols, which represent logical behaviors by one or a plurality of defects existing in the active element and/or in each of a plurality of signal lines from fanout branches which can propagate output signals of the active element, to each of a plurality of signal lines from fanout branches which can propagate output signals of the active element;
symbol injection means for a passive element for assigning new extended distinction symbols, which represent logical behaviors by one or a plurality of defects existing in the passive element and/or in each of a plurality of signal lines from fanout branches which can propagate output signals of the passive element, to each of a plurality of signal lines from fanout branches which can propagate output signals of the passive element; and fault locating means for locating the fault location by making use of distinction symbols assigned by the symbol injection means for an active element and the symbol injection means for a passive element.

2. The diagnosis device according to claim 1, further comprising occurrence probability providing means for calculating, for each possible faulty logic combination at a plurality of signal lines from fanout branches which can propagate output signals of the active element or the passive element, an occurrence probability which is based on relationship between voltage of the active element or the passive element and threshold voltage of each of a plurality of signal lines from the fanout branches and which are not equal for the whole faulty logic combination, wherein the diagnosis device diagnose with diagnosis value d(f,v) expressed by the following formula including occurrence probability p(Ri) calculated by the occurrence probability providing means:

$$d(f, v, Ri) = \frac{Level(f)}{Lmax} \times \frac{|Error\_PO(v) \cap Reach\_PO(f)|}{|Reach\_PO(f)|}$$

if Ri is the same as ObvRes(v) on Reach_PO(f); otherwise, d(f, v, Ri)=0, And, $$d(f, v) = \sum_{i=1}^{k} (d(f, v, Ri) \times p(Ri))$$

where f denotes a fault, v denotes a test vector, R1, R2, . . . , Rk (k≧1) denotes logical combinations at primary outputs, corresponding to k possible faulty logic combinations C1, C2, . . . , Ck at a site of f, respectively, Error_PO(v) for a test vector v denotes a set of all primary outputs on which an observed response ObvRes(v) has errors, Reach_PO(f) denotes a set of primary outputs which is reachable from an active element or a passive element with a fault f, Level(f) denotes a level of output of an element with a fault f, and Lmax denotes the maximum level in a circuit, assuming that all primary outputs have level 1.

3. A diagnosis device for diagnosing a fault location in a logic circuit of semiconductor equipment, comprising occurrence probability providing means for calculating, for each possible faulty logic combination at a plurality of signal lines from fanout branches which can propagate output signals of an active element or a passive element, an occurrence probability which is based on relationship between voltage of the active element or the passive element and threshold voltage of each of a plurality of signal lines from the fanout branches and which are not equal for the whole faulty logic combination wherein the diagnosis device diagnose with diagnosis value d(f,v) expressed by the following formula including occurrence probability p(Ri) calculated by the occurrence probability providing means:

$$d(f, v, Ri) = \frac{Level(f)}{Lmax} \times \frac{|Error\_PO(v) \cap Reach\_PO(f)|}{|Reach\_PO(f)|}$$

if Ri is the same as ObvRes(v) on Reach_PO(f); otherwise, d(f, v, Ri)=0, And, $$d(f, v) = \sum_{i=1}^{k} (d(f, v, Ri) \times p(Ri))$$

where f denotes a fault, v denotes a test vector, R1, R2, . . . , Rk (k≧1) denotes logical combinations at primary outputs, corresponding to k possible faulty logic combinations C1, C2, . . . , Ck at a site of f, respectively, Error_PO(v) for a test vector v denotes a set of all primary outputs on which an observed response ObvRes(v) has errors, Reach_PO(f) denotes a set of primary outputs which is reachable from an active element or a passive element with a fault f, Level(f) denotes a level of output of an element with a fault f, and Lmax denotes the maximum level in a circuit, assuming that all primary outputs have level 1.

4. The diagnosis device according to claim 3, further comprising:

equal occurrence probability providing means for calculating, for each possible faulty logic combination at a plurality of signal lines from fanout branches which can propagate output signals of an active element or a passive element, an occurrence probability which is equal for the whole faulty logic combination, wherein the diagnosis device can diagnose with diagnosis value d(f,v) expressed by the above formula including occurrence probability p(Ri) replaced by equal occurrence probability 1/k, calculated by the equal occurrence probability providing means; and switching means for switching, in response to selection instruction by a user, between the occurrence probability providing means and the equal occurrence probability providing means.

5. A diagnosis method for diagnosing a fault location of logical behavior caused by a physical defect existing in a multi-layered logic circuit, by representing the logical behavior with different distinction symbols assigned onto fanout branches, an active element of the logic circuit being connected between different layers and to one or a plurality of passive element, the passive element including a connection element for connecting active elements in the logic circuit between different layers, the diagnosis method comprising steps of:

causing symbol injection means to assign distinction symbols, which represent logical behaviors by one or a plurality of defects existing in the active element and/or in each of a plurality of signal lines from fanout branches which can propagate output signals of the active element, to each of a plurality of signal lines from fanout branches which can propagate output signals of the active element, and to assign new extended distinction symbols, which represent logical behaviors by one or a plurality of defects existing in the passive element and/ or in each of a plurality of signal lines from fanout branches which can propagate output signals of the passive element, to each of a plurality of signal lines from fanout branches which can propagate output signals of the passive element; and causing fault locating means to locate the fault location which occurred in the active element or the passive element by making use of distinction symbols assigned by the symbol injection means.

6. The diagnosis method according to claim 5, further comprising a step of causing occurrence probability providing means to calculate, for each possible logic combination at a plurality of signal lines from fanout branches which can propagate output signals of the active element or the passive element, an occurrence probability which is based on relationship between voltage of the active element or the passive element and threshold voltage of each of a plurality of signal lines from the fanout branches and which are not equal for the whole faulty logic combination, wherein the diagnosis device diagnose with diagnosis value d(f,v) expressed by the following formula including occurrence probability p(Ri) calculated by the occurrence probability providing means:

$$d(f, v, Ri) = \frac{Level(f)}{Lmax} \times \frac{|Error\_PO(v) \cap Reach\_PO(f)|}{|Reach\_PO(f)|}$$

if Ri is the same as ObvRes(v) on Reach_PO(f); otherwise, d(f, v, Ri)=0, And, $$d(f, v) = \sum_{i=1}^{k} (d(f, v, Ri) \times p(Ri))$$

where f denotes a fault, v denotes a test vector, R1, R2, . . . , Rk (k≧1) denotes logical combinations at primary outputs, corresponding to k possible faulty logic combinations C1, C2, . . . , Ck at a site of f, respectively, Error_PO(v) for a test vector v denotes a set of all primary outputs on which an observed response ObvRes(v) has errors, Reach_PO(f) denotes a set of primary outputs which is reachable from an active element or a passive element with a fault f, Level(f) denotes a level of output of an element with a fault f, and Lmax denotes the maximum level in a circuit, assuming that all primary outputs have level 1.

7. A program capable of causing a computer to execute the diagnosis method according to claim 6.

8. A recording medium recording the program according to claim 7 so as to be able to cause a computer to execute the program.

9. A program capable of causing a computer to execute the diagnosis method according to claim 5.

10. A recording medium recording the program according to claim 9 so as to be able to cause a computer to execute the program.

11. A diagnosis method for diagnosing a fault location in a logic circuit, comprising a step of causing occurrence probability providing means to calculate, for each possible logic combination at a plurality of signal lines from fanout branches which can propagate output signals of an active element or a passive element, an occurrence probability which is based on relationship between voltage of the active element or the passive element and threshold voltage of each of a plurality of signal lines from the fanout branches and which are not equal for the whole faulty logic combination, wherein the diagnosis device diagnose with diagnosis value d(f,v) expressed by the following formula including occurrence probability p(Ri) calculated by the occurrence probability providing means:

$$d(f, v, Ri) = \frac{Level(f)}{Lmax} \times \frac{|Error\_PO(v) \cap Reach\_PO(f)|}{|Reach\_PO(f)|}$$

if Ri is the same as ObvRes(v) on Reach_PO(f); otherwise, d(f, v, Ri)=0, And, $$d(f, v) = \sum_{i=1}^{k} (d(f, v, Ri) \times p(Ri))$$

where f denotes a fault, v denotes a test vector, R1, R2, . . . , Rk (k≧1) denotes logical combinations at primary outputs, corresponding to k possible faulty logic combinations C1, C2, . . . , Ck at a site of f, respectively, Error_PO(v) for a test vector v denotes a set of all primary outputs on which an observed response ObvRes(v) has errors, Reach_PO(f) denotes a set of primary outputs which is reachable from an active element or a passive element with a fault f, Level(f) denotes a level of output of an element with a fault f, and Lmax denotes the maximum level in a circuit, assuming that all primary outputs have level 1.

12. A program capable of causing a computer to execute the diagnosis method according to claim 11.

13. A recording medium recording the program according to claim 12 so as to be able to cause a computer to execute the program.

* * * * *